(12) United States Patent
Ogawa et al.

(10) Patent No.: US 8,127,265 B2
(45) Date of Patent: Feb. 28, 2012

(54) PATTERN VERIFICATION METHOD, PROGRAM THEREOF, AND MANUFACTURING METHOD OF SEMICONDUCTOR DEVICE

(75) Inventors: Ryuji Ogawa, Yokohama (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/067,567

(22) Filed: Jun. 9, 2011

(65) Prior Publication Data

US 2011/0294263 A1 Dec. 1, 2011

Related U.S. Application Data

(62) Division of application No. 12/585,073, filed on Sep. 2, 2009, now Pat. No. 7,987,435, which is a division of application No. 11/505,917, filed on Aug. 18, 2006, now abandoned.

(30) Foreign Application Priority Data

Aug. 25, 2005 (JP) ................................ 2005-244448

(51) Int. Cl.
*G06F 17/50* (2006.01)
(52) U.S. Cl. .............................. 716/137; 716/50; 716/52
(58) Field of Classification Search ........................ None
See application file for complete search history.

(56) References Cited

U.S. PATENT DOCUMENTS

| | | | |
|---|---|---|---|
| 6,470,489 B1 | 10/2002 | Chang et al. | |
| 6,473,882 B2 | 10/2002 | Mukai | |
| 6,783,904 B2 | 8/2004 | Strozewski et al. | |
| 6,907,596 B2 | 6/2005 | Kobayashi et al. | |
| 6,973,633 B2 | 12/2005 | Lippincott et al. | |
| 7,001,693 B2 | 2/2006 | Liebmann et al. | |
| 7,010,776 B2 | 3/2006 | Gallatin et al. | |
| 7,062,396 B2 | 6/2006 | Ogawa | |
| 7,065,738 B1 | 6/2006 | Kim | |
| 7,120,881 B2 | 10/2006 | Kodama et al. | |
| 7,131,104 B2 | 10/2006 | Gallatin et al. | |
| 7,155,689 B2 | 12/2006 | Pierrat et al. | |
| 7,181,707 B2 | 2/2007 | Kotani et al. | |
| 7,194,704 B2 | 3/2007 | Kotani et al. | |
| 7,202,488 B2 * | 4/2007 | Ota et al. | 250/492.22 |
| 7,269,804 B2 | 9/2007 | Tabery et al. | |
| 7,278,125 B2 | 10/2007 | Nojima | |
| 7,295,304 B2 | 11/2007 | Yamaguchi et al. | |
| 7,313,781 B2 | 12/2007 | Asano et al. | |

(Continued)

FOREIGN PATENT DOCUMENTS

JP 10-326010 12/1998

(Continued)

OTHER PUBLICATIONS

Notice of Reasons for Rejection issued by Japanese Patent Office, mailed on Oct. 19, 2010, in a counterpart Japanese application No. 2005-244448 (4 pages).

*Primary Examiner* — Leigh Garbowski
(74) *Attorney, Agent, or Firm* — Finnegan, Henderson, Farabow, Garrett & Dunner, L.L.P.

(57) ABSTRACT

A verification method of an integrated circuit pattern includes extracting a pattern which is not greater than a preset pattern size, extracting a pattern edge as a target of lithography simulation from the extracted pattern, and performing the lithography simulation on the extracted pattern edge to verify the integrated circuit pattern.

4 Claims, 12 Drawing Sheets

U.S. PATENT DOCUMENTS

| | | |
|---|---|---|
| 7,343,582 B2 | 3/2008 | Mukherjee et al. |
| 7,353,472 B2 | 4/2008 | DeMaris et al. |
| 7,412,671 B2 | 8/2008 | Ito et al. |
| 7,530,048 B2 | 5/2009 | Joshi |
| 7,571,417 B2 | 8/2009 | Izuha et al. |
| 2002/0188925 A1 | 12/2002 | Higashi |
| 2003/0014146 A1 | 1/2003 | Fuji et al. |
| 2004/0019872 A1 | 1/2004 | Lippincott et al. |
| 2004/0049722 A1* | 3/2004 | Matsushita .................. 714/724 |
| 2005/0208684 A1* | 9/2005 | Yamada et al. ................. 438/14 |
| 2005/0238221 A1 | 10/2005 | Hirano et al. |
| 2005/0250022 A1 | 11/2005 | Kotani et al. |

FOREIGN PATENT DOCUMENTS

| | | |
|---|---|---|
| JP | 2000-162758 | 6/2000 |
| JP | 2000-277426 | 10/2000 |
| JP | 2001-133956 | 5/2001 |
| JP | 2002-311561 | 10/2002 |
| JP | 2003-92237 | 3/2003 |
| JP | 2004-191957 | 7/2004 |
| JP | 2004-302110 | 10/2004 |
| JP | 2004-341157 | 12/2004 |
| JP | 2005-062750 | 3/2005 |
| JP | 2005-223252 | 8/2005 |

* cited by examiner

PATTERN VERIFICATION METHOD, PROGRAM THEREOF, AND MANUFACTURING METHOD OF SEMICONDUCTOR DEVICE

CROSS-REFERENCE TO RELATED APPLICATIONS

This application is a division of U.S. application Ser. No. 12/585,073, filed Sep. 2, 2009 now U.S. Pat. No. 7,987,435, which is a division of U.S. application Ser. No. 11/505,917, filed Aug. 18, 2006 now abandoned, and claims the benefit of priority from prior Japanese Patent Application No. 2005-244448, filed Aug. 25, 2005, the entire contents of all of which are incorporated herein by reference in their entirety.

BACKGROUND OF THE INVENTION

1. Field of the Invention

The present invention relates to an optical and X-ray lithography technology in manufacture of a semiconductor integrated circuit, a liquid crystal panel or the like, and more particularly to a verification method (lithography simulation) of a semiconductor integrated circuit, a verification program thereof, and a manufacturing method of a semiconductor device.

2. Description of the Related Art

In recent years, as a semiconductor integrated circuit manufacturing technology has been sophisticated and a difficulty level has been increased, it is becoming very hard to increase a process yield (a ratio of non-defective chips per wafer), and a critical pattern exists even if design rules are kept, resulting in a decrease in a process yield. Therefore, in order to increase a process yield, it has begun to attach importance to performing lithography simulation with respect to a design layout pattern before making a mask to reduce hot spots (critical patterns).

For example, Jpn. Pat. Appln. KOKAI Publication No. 2003-92237 provides means for setting semiconductor process conditions and mask pattern shapes avoiding occurrence of crystal defects based on simulation and setting robust semiconductor process conditions with respect to unevenness or fluctuations in semiconductor manufacturing process conditions or unevenness in mask pattern shapes.

However, a recent lithography verification tool takes the same amount of time as an optical proximity correction (OPC) processing time even under one set of conditions, and cannot feed back an error result to a design layout in a realistic turnaround time (TAT).

Therefore, there has been demanded realization of a semiconductor integrated circuit pattern verification method which can shorten a turnaround time, a program which allows a computer to execute this method, and a manufacturing method of a semiconductor device which realizes a pattern verified by this method and program on a semiconductor substrate.

BRIEF SUMMARY OF THE INVENTION

According to a first aspect of the invention, there is provided an integrated circuit pattern verification method which includes:

extracting a pattern which is not greater than a preset pattern size;

extracting a pattern edge as a target of lithography simulation from the extracted pattern; and performing the lithography simulation on the extracted pattern edge to verify the pattern.

According to a second aspect of the invention, there is provided an integrated circuit pattern verification method which includes:

sorting integrated circuit patterns into a plurality of pattern groups based on pattern sizes or pattern types; and performing lithography simulation on the plurality of sorted pattern groups while changing respective conditions to verify the patterns.

DETAILED DESCRIPTION OF THE INVENTION

Figure 1:
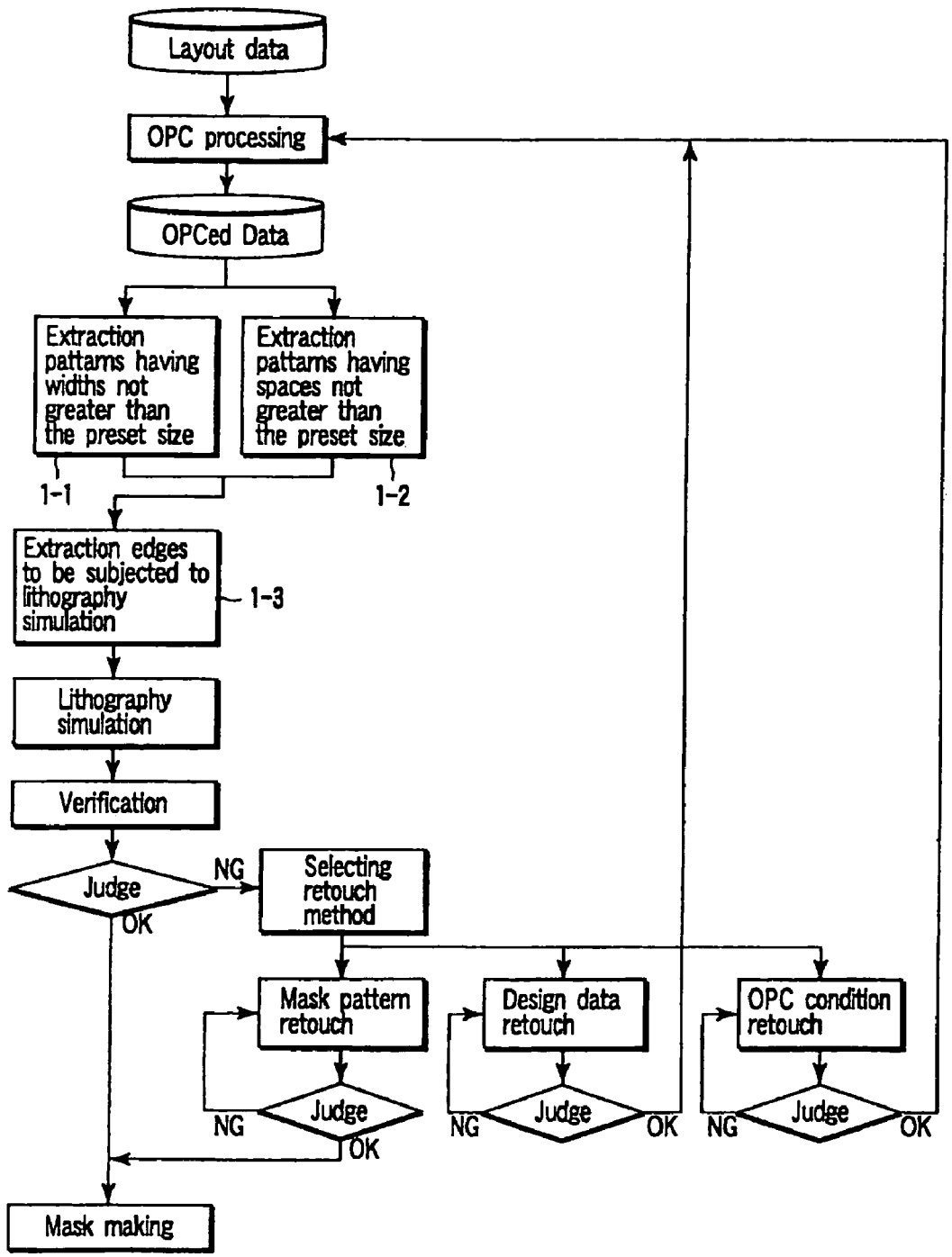
FIG. 1 is a view showing a flowchart of a pattern verification method according to a first embodiment.

In embodiments according to the present invention mentioned below, when performing lithography verification of a design layout in a full chip, highly accurate lithography verification is effected with respect to an important pattern or a critical pattern in terms of a device, and rough lithography verification is carried out with respect to a pattern which is not very important in terms of a device and has a large allowed tolerance. As a result, a TAT can be improved without decreasing a verification accuracy, and a systematic defect such as a problem in lithography or OPC can be found before manufacturing a semiconductor device, thereby avoiding a reduction in a process yield of a semiconductor device.

In more detail, as a semiconductor integrated circuit technology has become sophisticated, a difficulty level has been increased and a margin has been reduced with respect to design rules, it has been considered that a critical position must be further accurately extracted and a mask pattern or a design layout pattern must be retouched in order to increase a process yield. Programming the above-described technology and executing it by a computer can reduce a TAT which is a major bottleneck when performing lithography simulation in a full chip.

Further, if verification can be performed in a realistic time as one of data verifications before manufacturing a mask, occurrence of a problem in a wafer can be avoided, thus enabling manufacture of a semiconductor device with a high process yield.

Prior to explaining embodiments according to the present invention, conventional problems will be described in more detail. With recent miniaturization of a semiconductor integrated circuit manufacturing technology, forming a pattern according to a design on a wafer is difficult even though the same mask as a design pattern is used because of an increase in influence of diffraction of exposure light on a dimension on a wafer and complication of mask and wafer process techniques for accurate formation of a fine pattern.

In order to improve a fidelity level of a design pattern, there are used techniques called optical proximity correction (OPC) and process proximity correction (PPC) which create a mask pattern required to form the same pattern as the design pattern on a wafer. These techniques will be generically referred to as OPC hereinafter.

The OPC technique is a very effective technique, and current fine processing cannot be achieved without this technique. However, the OPC technique must be exercised within limits (design rules, a pattern layout, an edge length, an evaluation point, hierarchical processing and others), and cases where contradictory correction is required on rare occasions or correction cannot be sufficiently performed are increased with miniaturization. Such a problem will be referred to as an OPC problem hereinafter.

Such a problem becomes a factor which reduces a process yield as a systematic defect in manufacture of a semiconductor integrated circuit, and hence lithography verification which verifies fidelity with respect to a design layout pattern is required.

At present, as lithography verification, simulation-based check (which will be referred to as lithography rule check hereinafter) is carried out. In the lithography rule check, lithography simulation is executed with respect to a pattern after OPC, an obtained pattern is compared with a design pattern, and a deviation between these patterns is checked to detect a part which can be a problem in terms of a device. Error contents can be sorted into error types (open, short circuit, shortening and others), error level (fatal (greatly reducing a process yield)) OPC problems (which will be referred to as fatal errors hereinafter), OPC problems which are not fatal but do not have sufficient margins (which will be referred to as gray zone errors hereinafter), and others.

Since the current lithography rule check uses lithography simulation, like OPC processing, a processing time which is substantially equal to that in the OPC processing is required. Furthermore, when verifying several conditions in a full chip by the simulation under conditions considering unevenness in manufacture, twofold to threefold considerable computer resources and processing time are required as compared with the OPC processing, and hence performing verification in a practical time is difficult.

Since a flow after the lithography simulation in a prior art requires a considerable processing time and machine resources, such processing cannot be actually executed before making a mask if priority is given to a product schedule. In practice, the processing must be executed concurrently with manufacture of a mask to make it in time before production of a semiconductor device, or the lithography verification must be eliminated.

The following embodiments according to the present invention includes performing sorting based on pattern sizes or pattern types in the lithography rule check; executing highly accurate lithography simulation with respect to a pattern group sorted into patterns having widths or spaces which are not greater than a preset size or important patterns; and executing simulation with a reduced simulation accuracy or simple dimension check with respect to patterns having widths or spaces which are not smaller than a preset size or non-important patterns sorted based on a device importance level. As a result, a TAT can be improved without lowering a verification accuracy, and a systematic defect such as a lithography/OPC problem can be found before manufacture of a mask and a semiconductor device, thereby avoiding a reduction in a process yield.

Embodiments according to the present invention will now be described hereinafter with reference to the accompanying drawings.

First Embodiment

A description will be given as to an example where patterns which are not greater than a preset pattern size are extracted and lithography simulation is executed with respect to the extracted patterns alone in a first embodiment. FIG. 1 is a flowchart showing a pattern verification method according to the first embodiment. Step numbers are given to steps specific to the embodiment. This is also applied to the following embodiments.

First, layout data is subjected to OPC processing to acquire OPCed data. Based on this OPCed data, extraction of patterns having widths which are not greater than a preset size (a step 1-1) and extraction of patterns having spaces which are not greater than a preset size (a step 1-2) are executed. Then, edges of the extracted patterns are extracted (a step S1-3). These steps 1-1 to 1-3 are characteristic parts of this embodiment, and hence they will be described in detail later.

Then, the extracted edges are subjected to lithography simulation for verification. It is to be noted that verification means that lithography simulation is carried out, an obtained pattern is compared with a design pattern to check a deviation so that a part which may result in a problem in terms of a device is detected. When a judgment on a verification result is successful, manufacture of a mask begins. When it fails, a retouch method is examined to carry out mask pattern correction, a design pattern correction or OPC correction. When a judgment on mask pattern correction is successful, the control directly advances to manufacture of a mask. When a judgment on design pattern retouch and OPC retouch is successful, the control returns to OPC processing to repeat the OPC processing and the subsequent processing.

Figure 2:
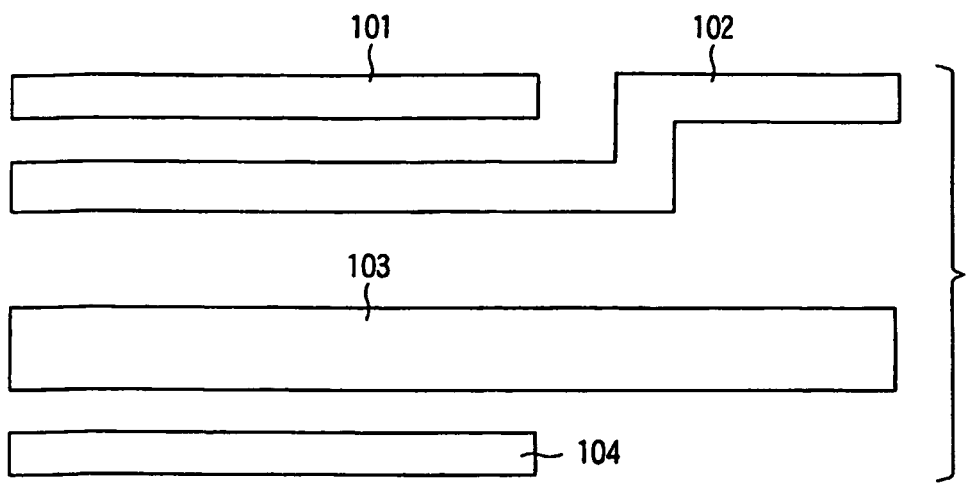
FIG. 2 is a view showing an example of wiring lines according to the first embodiment.
Figure 3:
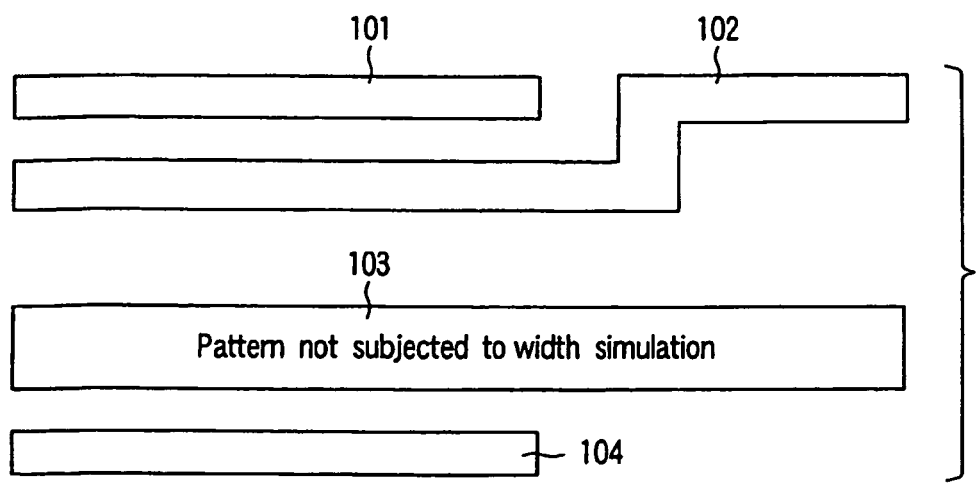
FIG. 3 is a view illustrating extraction of wiring lines having widths which are not greater than a preset size.

The steps 1-1 to 1-3 will now be described in detail. FIG. 2 shows an example of a wiring pattern in the OPCed data, and wiring lines 101 to 104 exist. Wiring lines having wiring widths which are not greater than a present size are extracted from these wiring lines at the step 1-1, and it is assumed that the wiring lines 101, 102 and 104 are extracted in this case (FIG. 3).

Figure 4:
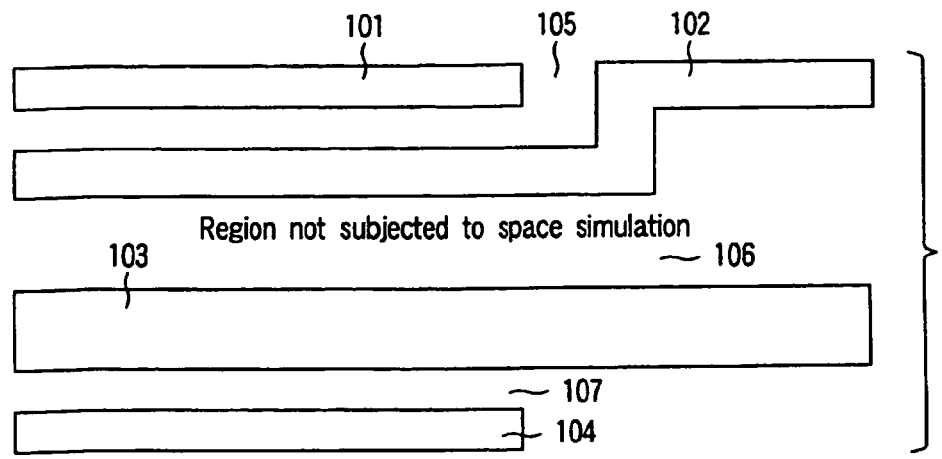
FIG. 4 is a view illustrating extraction of wiring lines having spaces which are not greater than a preset size.

Then, at the step 1-2, pattern spaces which are not greater than a preset size are extracted from the OPCed data. In the example shown in FIG. 2, a space 105 between the wiring lines 101 and 102 and a space 107 between the wiring lines 103 and 104 are extracted as illustrated in FIG. 4.

Subsequently, edges of the extracted wiring width and wiring spaces are extracted as indicated by solid lines in FIG. 5. As a remarkable point, although the width of the wiring line 103 is not extracted, the space 107 of the same is extracted, and hence an edge portion 113 is extracted. The above-described lithography simulation is executed with respect to the edges extracted in this manner.

As described above, in this embodiment, lithography simulation is restricted to parts where a systematic defect such as open, short circuit or shortening is apt to occur in manufacture of a semiconductor device, thereby enabling more efficient verification in a short time.

Second Embodiment

Figure 6:
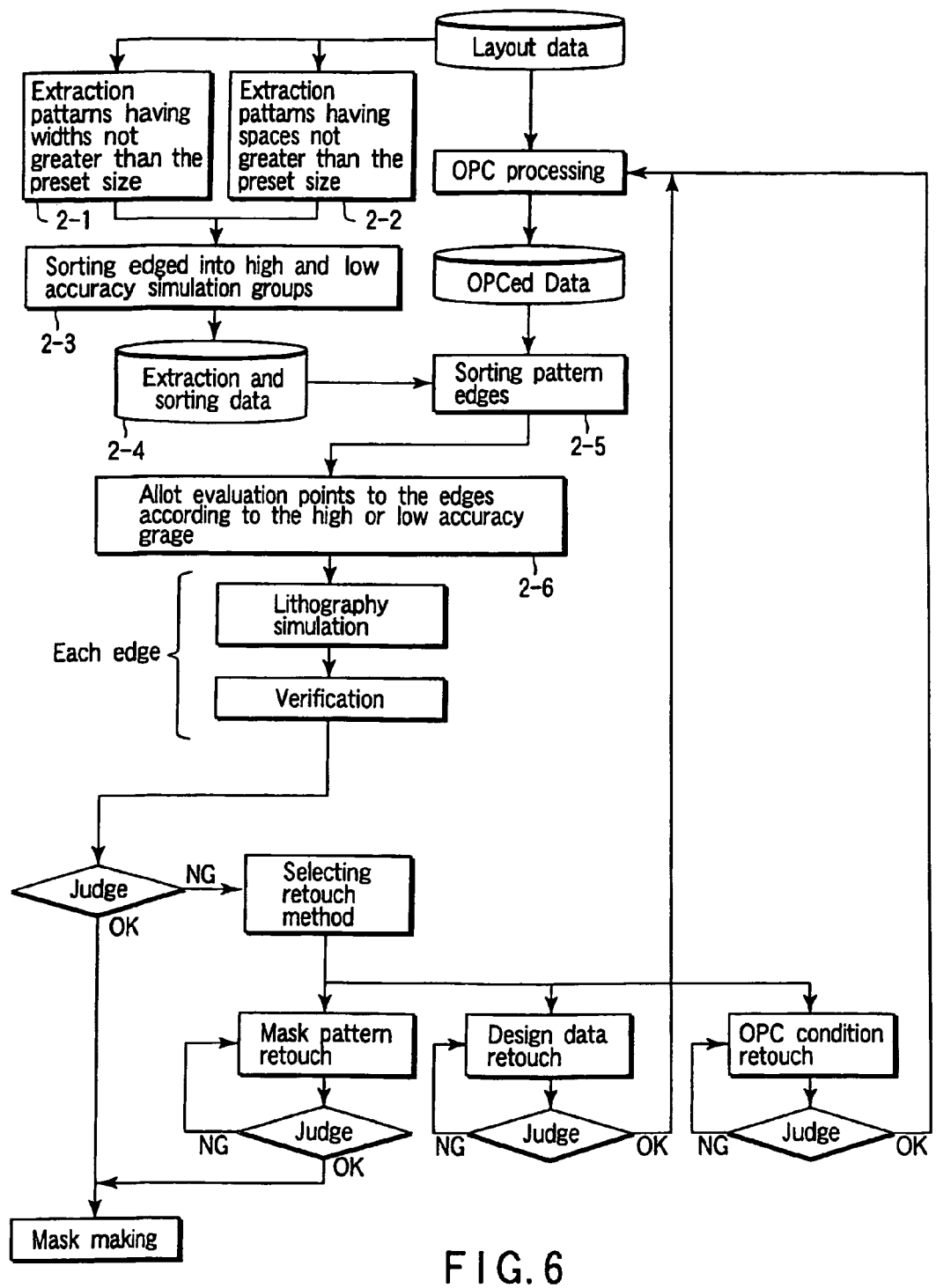
FIG. 6 is a view showing a flowchart of a pattern verification method according to a second embodiment.

A description will now be given as to an example where data which is not greater than a preset size is extracted from layout data in a second embodiment. FIG. 6 is a flow chart concerning a pattern evaluation method according to the second embodiment.

First, patterns having widths and spaces which are not greater than preset sizes are extracted from layout data like FIGS. 2 to 4 in the first embodiment (steps 2-1, 2-2). Since pattern shapes are better than those in OPCed data, patterns can be extracted with a high level of fidelity.

Then, the extracted edges are sorted into high and low accuracy simulation groups at a step 2-3, edge extraction and sorting information is output at a step 2-4, and the OPCed data is subjected to edge sorting based on the output data at a step 2-5.

Figure 7:
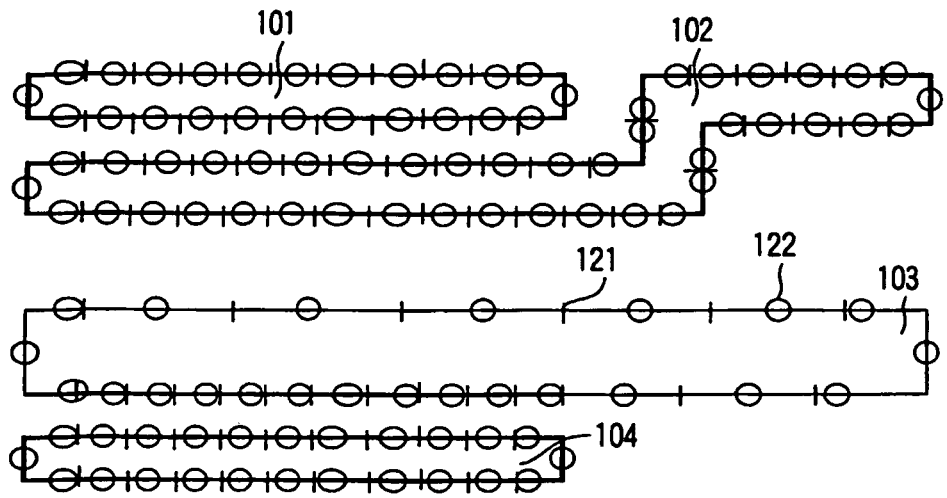
FIG. 7 is a view illustrating weighting of evaluation target edges.

Subsequently, at a step 2-6, evaluation points of the edges with the high accuracy grade are increased, and evaluation points of the edges with the low accuracy grade are reduced. Assuming that 111 to 114 in FIG. 5 extracted in the first embodiment are determined as edges with the high accuracy grade, the number of simulation evaluation points 122 is increased by increasing edge division points 121 of the edges with the high accuracy grade as shown in FIG. 7. Based on this processing, the edges with the increased evaluation points are highly accurately evaluated, and the accuracy is reduced to a necessary minimum level with respect to the edges with the reduced evaluation points, thereby reducing a TAT.

Since parts other than those in the flowchart are the same as those in the first embodiment, thus eliminating a repeated explanation.

Third Embodiment

Although sorting of edges is carried out based on pattern size in the second embodiment, the present invention can be likewise realized by sorting edges based on pattern densities. Such an example will be explained in a third embodiment. It is to be noted that a dense pattern can be defined as a line-and-space pattern which is not greater than a preset size or a pattern having large interconnection numbers per unit area. A sparse pattern means patterns other than the dense pattern.

Specifically, at the step 2-1 (or 2-2) in the flowchart of FIG. 6, dense patterns and sparse patterns are extracted. Then, at the step 2-3, patterns sorted as the dense pattern are determined as edges subjected to evaluation with a high accuracy, and patterns sorted as the sparse pattern are determined as edges subjected to evaluation with a reduced simulation accuracy.

Then, like the second embodiment, lithography simulation can be restricted to parts where a systematic defect such as open, short circuit or shortening is apt to occur in manufacture of a semiconductor device, thereby enabling more efficient verification in a short time.

Fourth Embodiment

Figure 8:
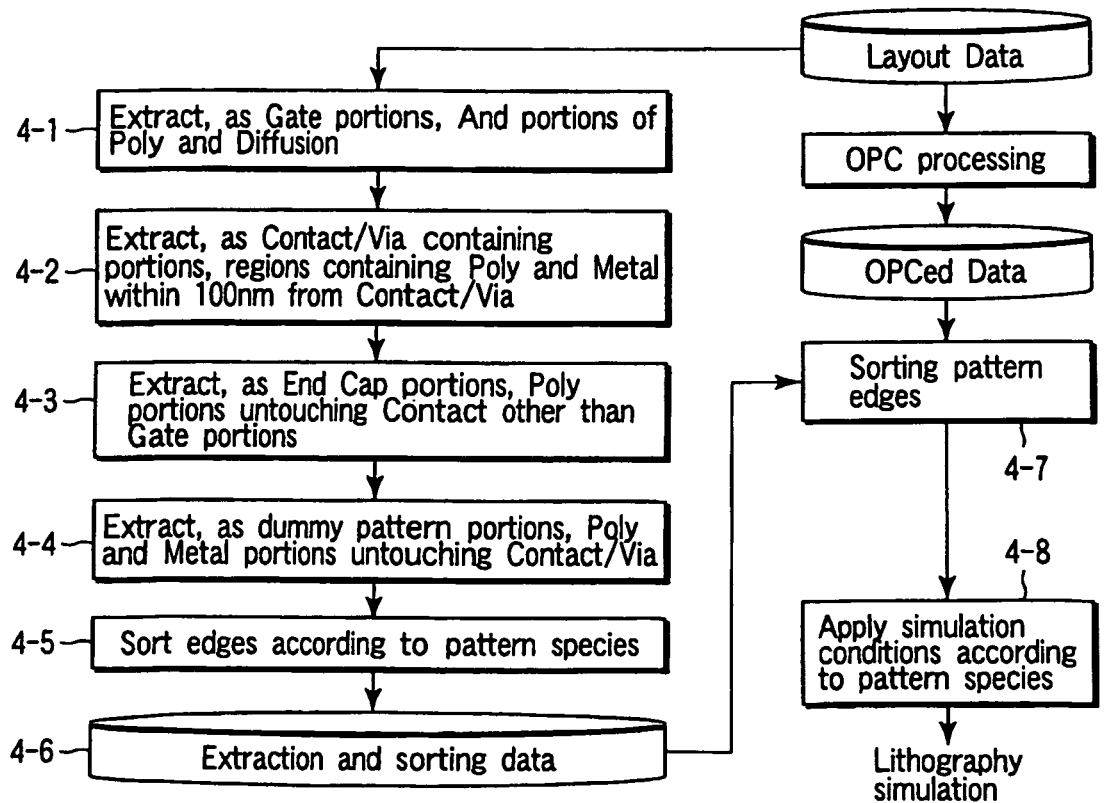
FIG. 8 is a view showing a flowchart of a pattern verification method according to a fourth embodiment.
Figures 9A, 9B:
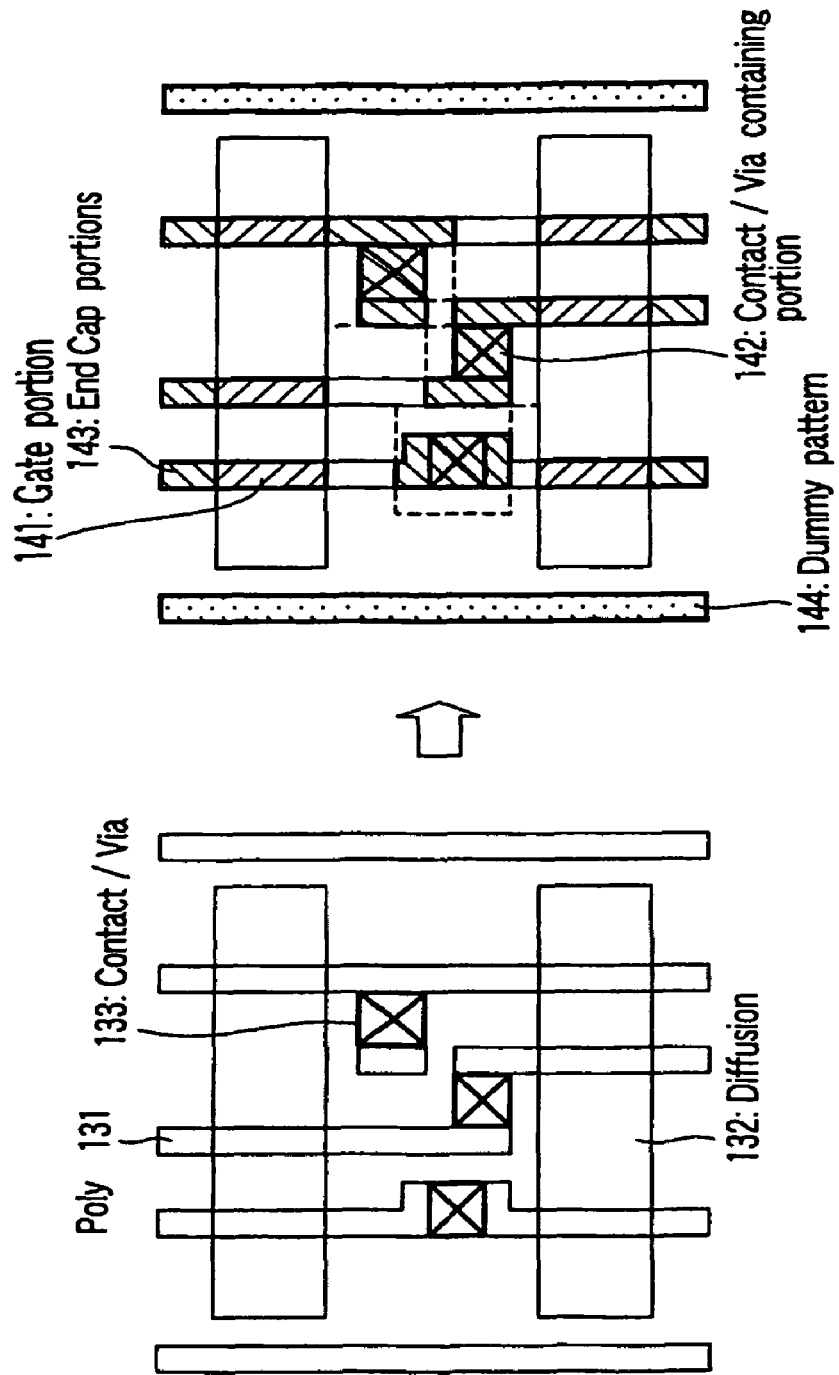
FIGS. 9A and 9B are views illustrating a pattern verification method of MISFET.

A description will now be given as to a verification method of an MISFET pattern in a fourth embodiment. FIG. 8 is a flowchart showing a pattern verification method according to the fourth embodiment. At a step 4-1 in the flowchart of FIG. 8, a portion (an And portion) where a logical product of a gate wiring line (Poly) 131 and a source/drain diffusion layer (Diffusion) 132 can be taken is extracted as a Gate portion. In case of such a pattern as shown in FIG. 9A, 141 in FIG. 9B is extracted as a Gate portion.

Then, at a step 4-2, a gate wiring (Poly) or a metal portion contained in a region within 100 nm from a Contact/Via 133 is extracted as a Contact/Via containing portion. In case of such a pattern as shown in FIG. 9A, 142 in FIG. 9B is extracted as the Contact/Via containing portion.

Subsequently, at a step 4-3, a gate wiring line (Poly) untouching a Contact other than Gate portions is extracted as an End Cap portion. In case of such a pattern as shown in FIG. 9A, 143 in FIG. 9B is extracted as the End Cap portion.

Then, at a step 4-4, wiring lines (Poly/Metal) untouching the Contact/Via are extracted as dummy pattern portions. In case of such a pattern as shown in FIG. 9A, 144 in FIG. 9B is extracted as the dummy pattern portion.

Subsequently, at a step 4-5, edges are sorted in accordance with pattern types. If a plurality of pattern types correspond to one edge, edges are sorted in such a manner that simulation conditions to be applied become conditions which are severe for manufacture of a semiconductor.

Then, edge extraction and sorting information is output at a step 4-6, and OPCed data is subjected to edge processing based on the output data at a step 4-7, and simulation conditions corresponding to pattern types are applied at a step 4-8.

According to this processing, lithography simulation can be restricted to parts where a systematic defect is apt to occur because of circuit characteristics of a semiconductor device, and verification can be more efficiently carried out in a short time.

The above has described extraction of the Gate portion, the End Cap portion, the Contact/Via containing portion and the dummy pattern portion. However, if there is a position where unevenness in processes affects a process yield because of circuit characteristics, this position should be included as an extraction target.

Fifth Embodiment

A description will now be given as to how a lithography simulation model is applied to pattern edges extracted and sorted based on pattern types, sizes and densities in a fifth embodiment.

Figure 10:
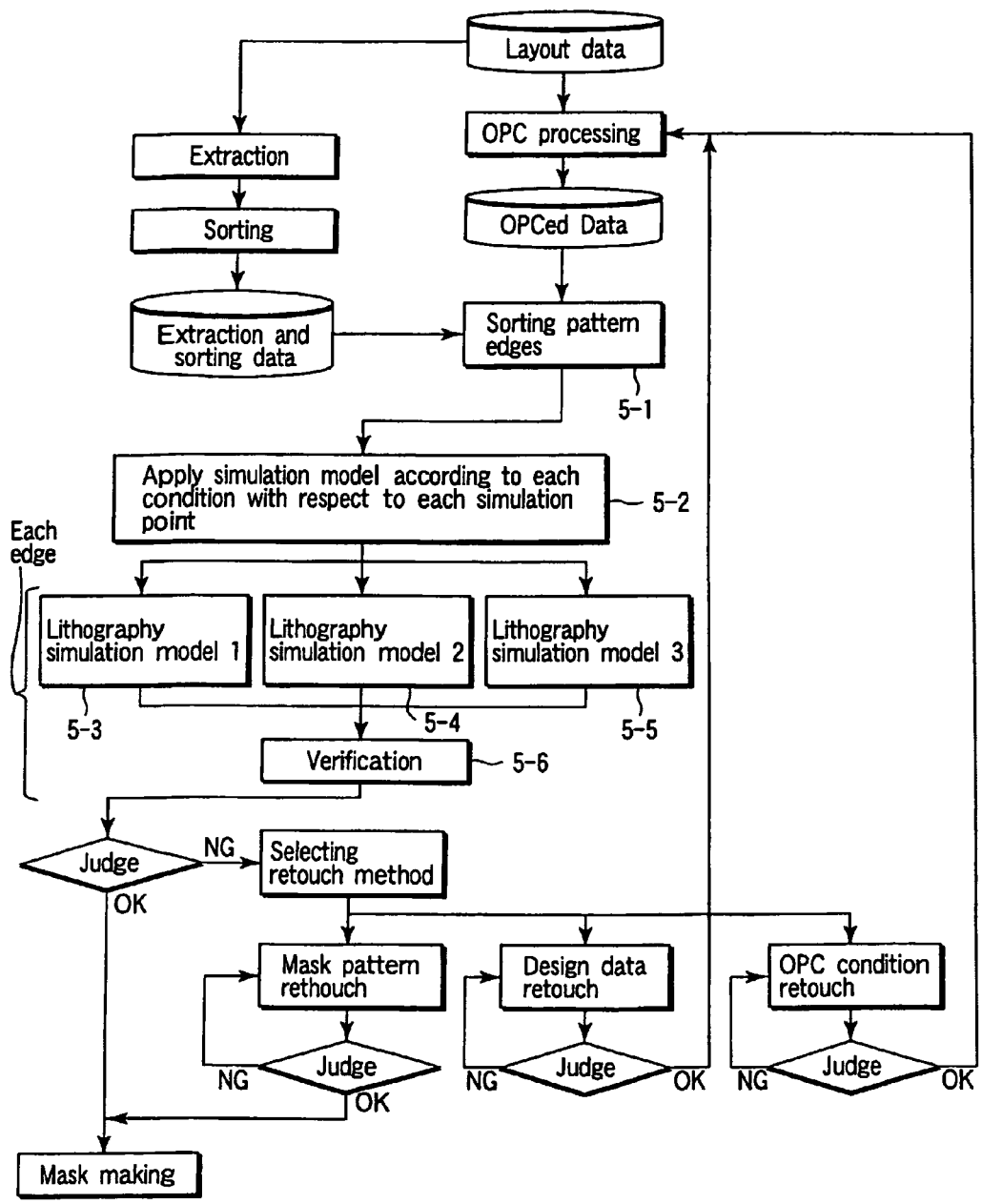
FIG. 10 is a view showing a flowchart of a pattern verification method according to a fifth embodiment.

FIG. 10 is a flowchart showing a pattern verification method according to the fifth embodiment. At a step 5-2 in the drawing, a simulation model corresponding to respective conditions is applied in accordance with each simulation point with respect to patterns sorted based on pattern types, sizes or densities at a step 5-1. At this time, simulation using a highly accurate simulation model is applied to a pattern group sorted into patterns having small pattern size values, patterns which are important in terms of a device or dense patterns.

The simulation model is one of a vector model, a step model on an exposure mask, a step model on a processing substrate, an edge model, a resist material model and a resist process model, and the highly accurate simulation model includes more such models.

Simulation is separately performed by using each simulation model having a necessary minimum accuracy optimized in accordance with each pattern and edge sorted at the steps 5-3, 5-4 and 5-5, and verification is executed at a step 5-6. Consequently, edges requiring a verification accuracy are evaluated by using a simulation model with a higher accuracy, and edges requiring no verification accuracy in particular are evaluated by using a simulation model with a reduced necessary minimum accuracy, thereby shortening a TAT.

Sixth Embodiment

A description will now be given as to how an objective range taken into lithography simulation is applied to pattern edges extracted and sorted based on pattern types, sizes or densities in a sixth embodiment.

Figure 11:
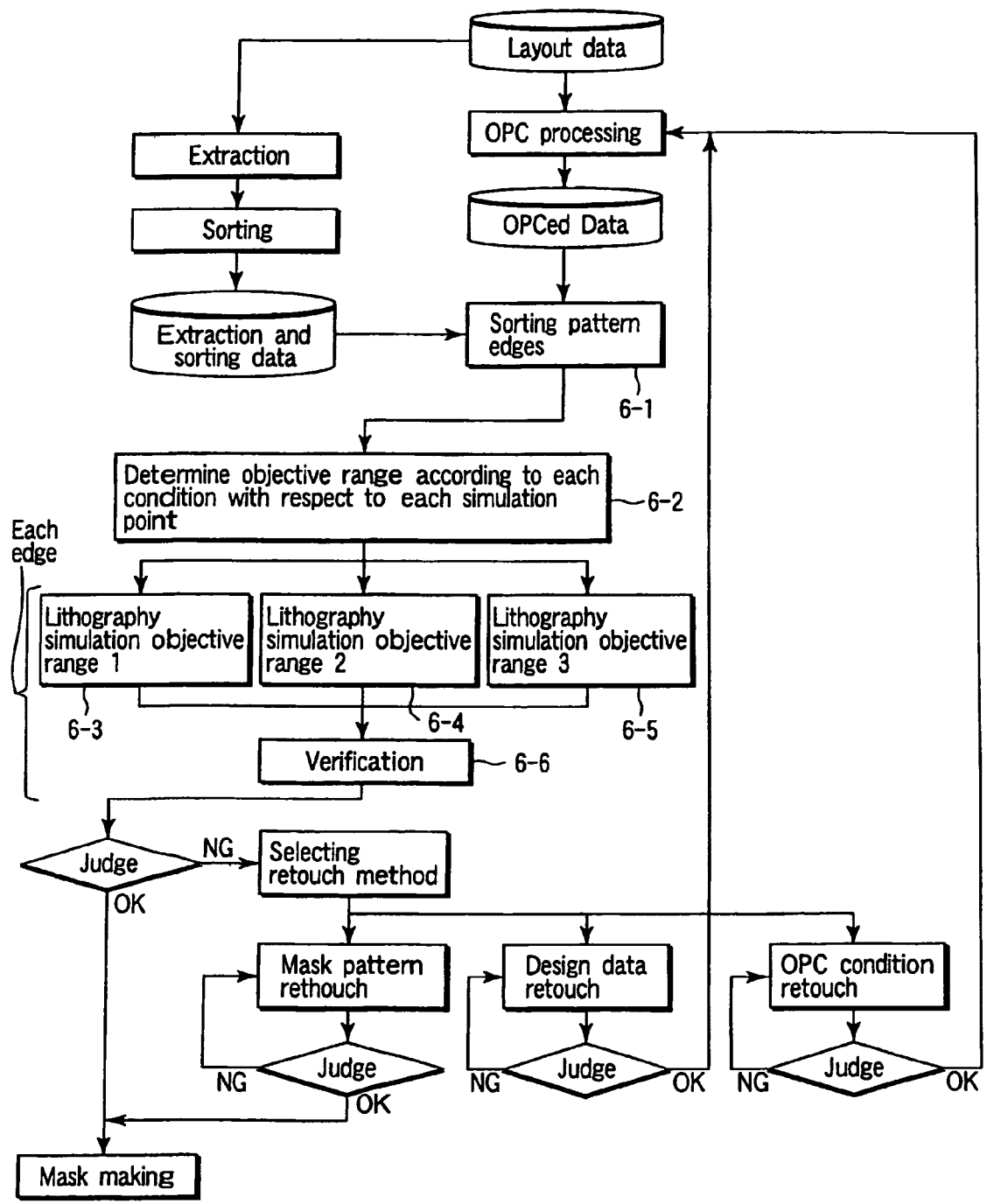
FIG. 11 is a view showing a flowchart of a pattern verification method according to a sixth embodiment.
Figure 12:
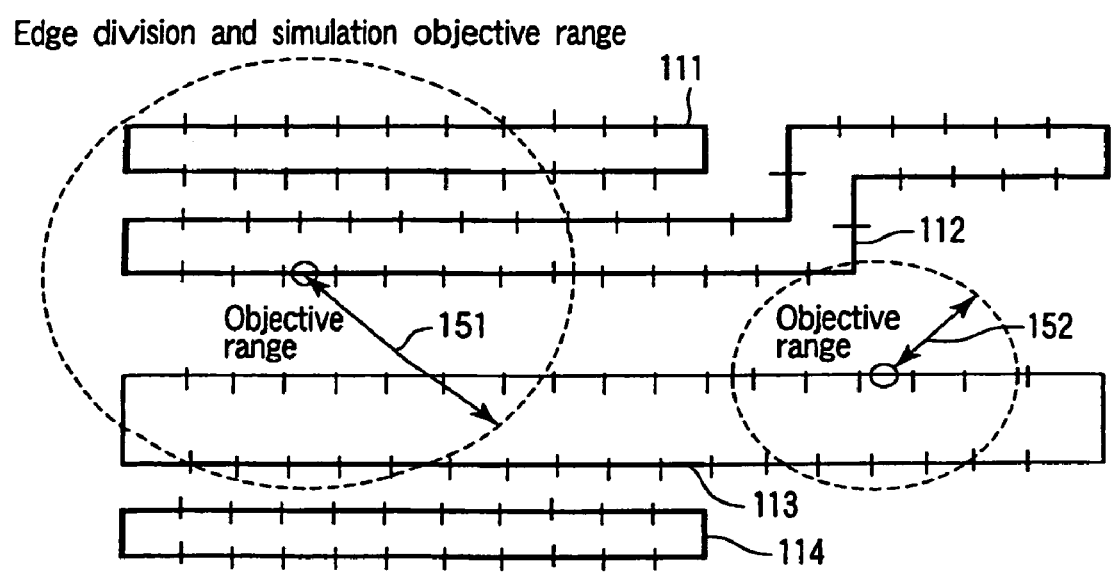
FIG. 12 is a view illustrating objective ranges in edge evaluation.

FIG. 11 is a flowchart showing a pattern verification method according to the sixth embodiment. At a step 6-2, an objective range corresponding to respective conditions is applied in accordance with each simulation point with respect to patterns sorted based on pattern types, sizes or densities. At this time, simulation having an extensively set objective range is applied to a pattern group sorted into patterns with small pattern dimension values, patterns which are important in terms of a device or dense patterns.

Figure 5:
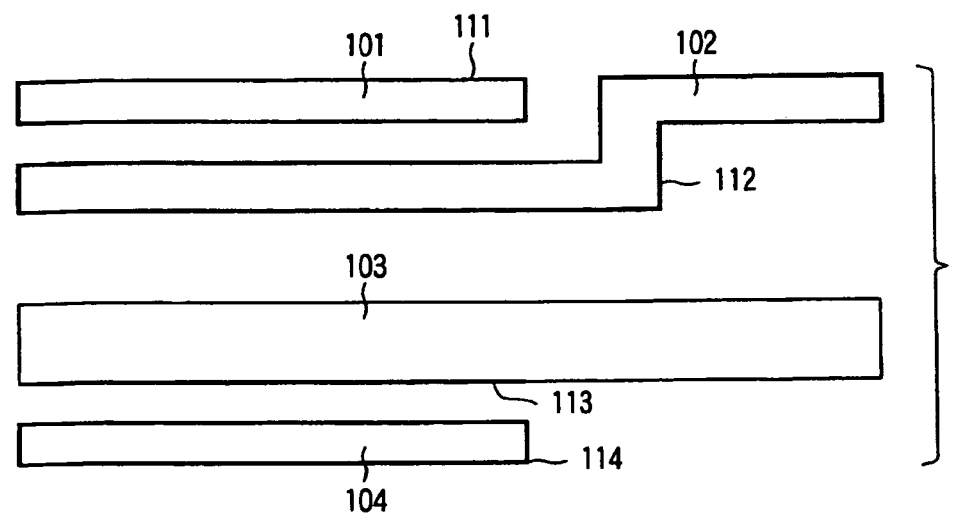
FIG. 5 is a view illustrating target edges in lithography simulation.

Assuming that 111 to 114 in FIG. 5 extracted in the first embodiment are edges subjected to highly accurate evaluation, an objective range 151 applied when performing simulation with an evaluation point of each of edges subjected to highly accurate evaluation is set wider than an objective range 152 applied when performing simulation concerning edges requiring no highly accurate evaluation.

Simulation in which each objective range optimized in accordance with each sorted pattern and edge is taken is separately carried out at the steps 6-3, 6-4 and 6-5, and verification is executed at a step 6-6. As a result, in regard to edges requiring a verification accuracy, patterns in a wider range are taken in to carry out simulation. In regard to edges which do not require a verification accuracy in particular, an influence of patterns in a necessary minimum range alone is taken in, thereby shortening a TAT.

Seventh Embodiment

A description will now be given as to how error causes to be taken into lithography simulation are applied to pattern edges extracted and sorted based on pattern types, sizes or densities in a seventh embodiment.

Figure 13:
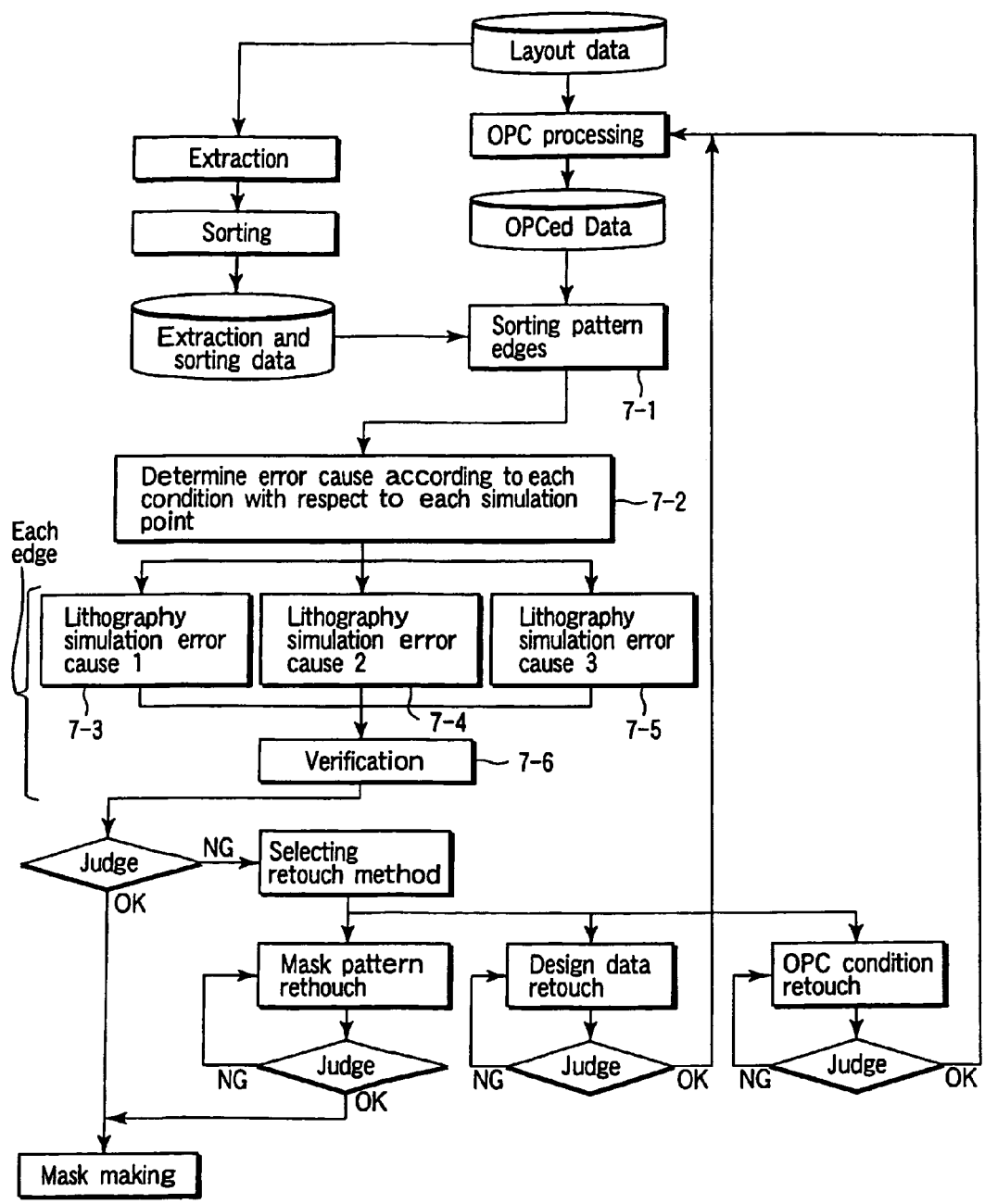
FIG. 13 is a view showing a flowchart of a pattern verification method according to a seventh embodiment.

FIG. 13 is a flowchart showing a pattern evaluation method according to the seventh embodiment. At a step 7-2, error causes corresponding to respective conditions are applied to patterns sorted based on pattern types, sizes or densities at a step 7-1 in the drawing in accordance with each simulation point. At this time, the number of error causes is increased with respect to a pattern group sorted into patterns having small pattern size values, patterns important in terms of a device or dense patterns.

The error cause is one of an error concerning a mask, an error concerning an illumination system, an error concerning a focusing system and an error concerning a resist, and in particular, the error concerning the illumination system is unevenness in dose amounts in manufacture and the error concerning the focusing system is unevenness in focus amounts in manufacture.

Simulation in which respective error causes optimized in accordance with each sorted pattern and edge are taken is separately carried out at steps 7-3, 7-4 and 7-5, and verification is executed at a step 7-6. As a result, simulation considering an influence of more error causes is performed with respect to an edge requiring a verification accuracy, and an influence of necessary minimum error causes alone is taken in with respect to an edge which does not require a verification accuracy in particular, thereby shortening a TAT.

Eighth Embodiment

A description will now be given as to simple dimension check (design rule check: DRC) which is carried out based on rules in place of lithography simulation in an eight embodiment.

It is good enough to check whether a maximum correction amount expected in mask design processing (MDP) or optical proximity correction (OPC) is exceeded with respect to a pattern to which a very large tolerance is allowed, e.g., a pattern which does not greatly affect a process yield or a circuit operation even though a dimension is uneven like a dummy pattern or a pattern whose unevenness in dimension is not concerned as long as it does not have an open defect or a short circuit defect (e.g., a power supply wiring line which is not adjacent to a signal wiring line), or check whether a minimum mask value which does not result in an open defect or a short circuit defect is kept with respect to a pattern whose minimum dimension alone is specified, and the rule-based check (DRC) can suffice even if lithography simulation is not carried out.

Additionally, isolated patterns separated from other patterns by 1 μm or more have the same optical influence by peripheral patterns, and hence they have the same dimension after OPC. Since such a pattern type having the same optical influence has the same OPC result, the rule-based check (DRC) can suffice even if lithography simulation is not performed. As the patterns having the same optical influence by peripheral patterns, a cell array pattern in which the same cell patterns are aligned with the same pitch like an SRAM or a DRAM is of course included.

Ninth Embodiment

A description will now be given as to how a verification specification applied after lithography simulation is applied to pattern edges extracted and sorted based on pattern types, sizes or densities.

Figure 14:
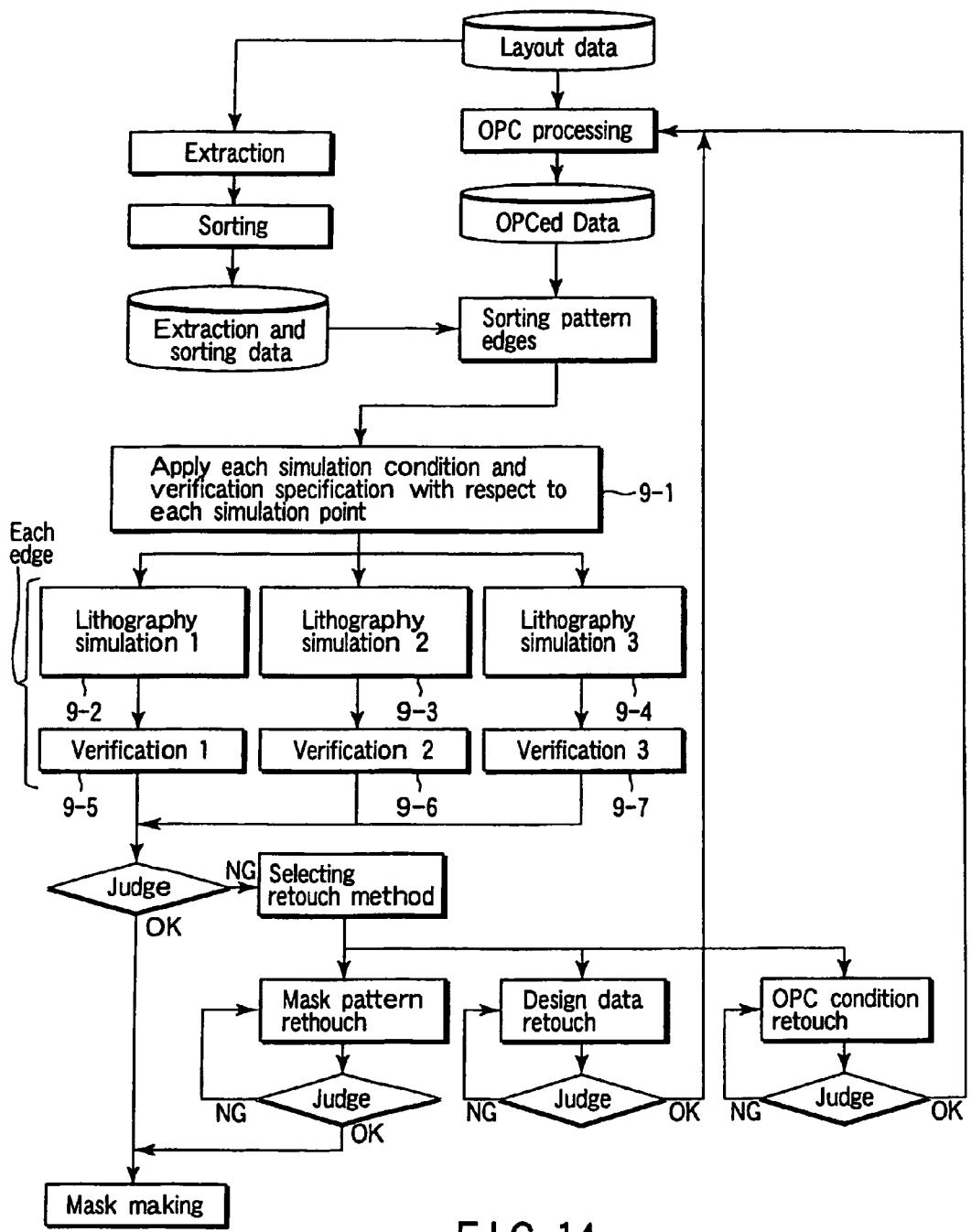
FIG. 14 is a view showing a flowchart of a pattern verification method according to a ninth embodiment.

FIG. 14 is a flowchart showing a pattern verification method according to a ninth embodiment. Simulation conditions (steps 9-2, 9-3 and 9-4) and verification specifications (steps 9-5, 9-6 and 9-7) corresponding to respective conditions are applied to patterns sorted based on pattern types, sizes or densities in accordance with each simulation point at a step 9-1. At this time, lithography conditions at the steps 9-2, 9-3 and 9-4 may be all the same.

A verification specification which is rigorous in manufacture of a semiconductor is applied to a pattern group sorted into patterns having small pattern size values, patterns which are important in terms of a device or dense patterns. The rigorous verification specification in manufacture of a semiconductor means that a tolerance with respect to a wafer target dimension is small or the number of verification items is large.

At steps 9-5, 9-6 and 9-7, verification is carried out by using respective verification specifications optimized in accordance with each sorted pattern and edge. That is, verification is carried out with small tolerances for more verification items with respect to edges requiring a verification accuracy, and a verification specification with a necessary minimum number of large tolerances is used with respect to edges which do not require a verification accuracy in particular, thereby reducing patterns whose verification time must be decreased and which must be retouched after verification. As a result, an entire TAT including a retouch rework time after verification can be reduced.

Figure 15:
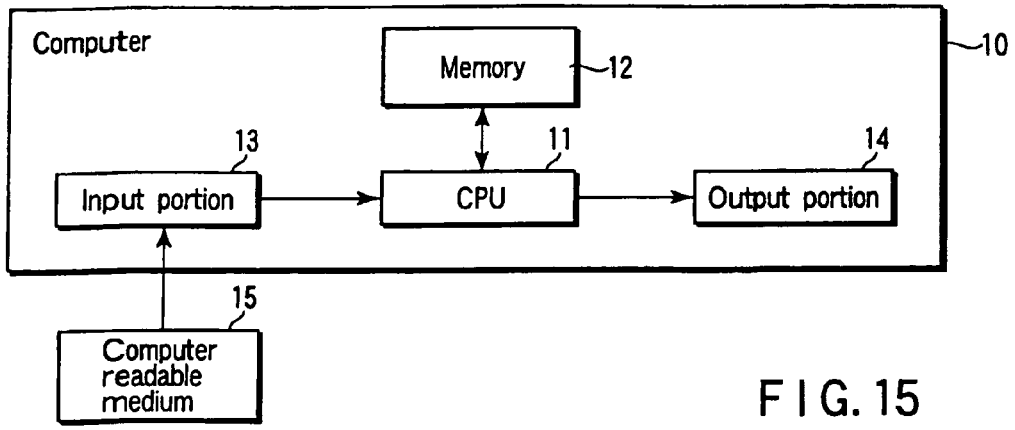
FIG. 15 is a system chart when the pattern verification method according to the present invention is executed by using a computer.

It is to be noted that the procedures described in the foregoing embodiment can be executed in such a computer system 10 as shown in FIG. 15. The computer system 10 is provided with a CPU 11, a memory 12, input/output portions 13 and 14, writes the above-mentioned procedures as a program in a recording medium 15 such as a magnetic disk, an optical disk like a CD, a DVD or an MO or a semiconductor memory, and reads this program. Such a computer system can be incorporated in various kinds of apparatuses or applied to various kinds of apparatuses by being transmitted by a communication medium.

Figure 16:
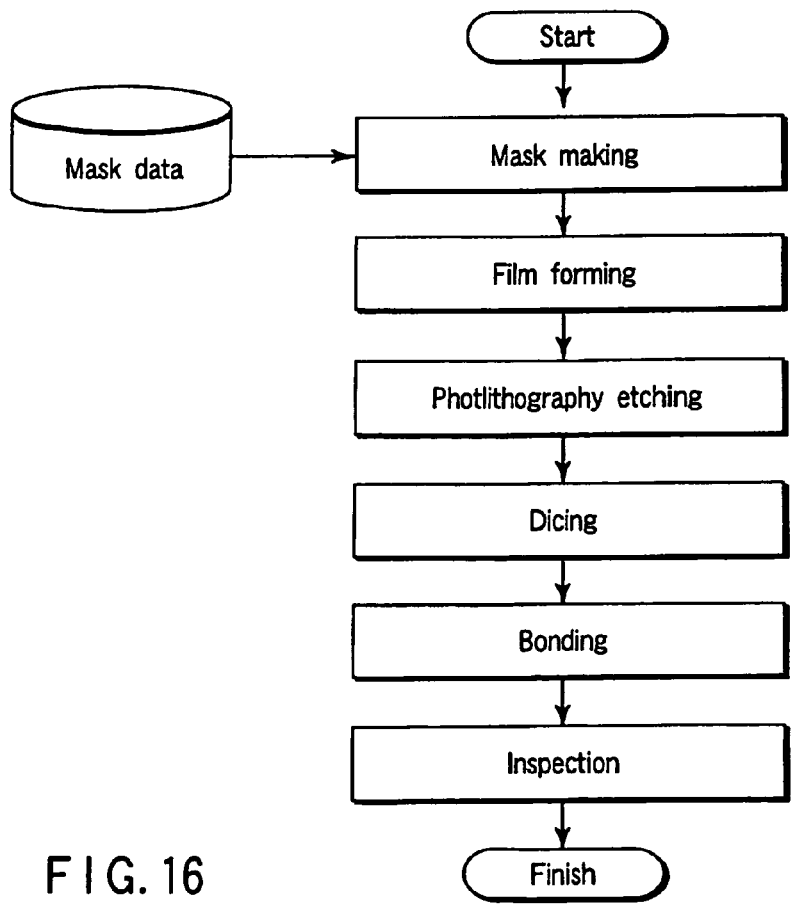
FIG. 16 is a flowchart showing a manufacturing method of a semiconductor device based on mask data created by using the pattern verification method according to the present invention.

Further, mask data obtained in the first to ninth embodiments can be used to manufacture a semiconductor device. That is, as shown in a flowchart of FIG. 16, a mask is created, a predetermined film is formed on a semiconductor wafer, and patterning is performed by lithography. After repeating this process for the necessary number of times, the semiconductor wafer is diced into a plurality of chips. Each chip is die-bonded to a predetermined package, and a terminal of the package is bonded to a wiring line (a pad) on the chip, thereby manufacturing a semiconductor device.

As described above, according to the pattern verification method of the present invention, a pattern verification time can be reduced, and a regular dicing process, mount process, die-bonding process, packaging process and others can be carried out with respect to the wafer on which the thus obtained verified pattern is formed, thereby producing a semiconductor device.

Although the above has described the pattern verification method of the present invention through the embodiments, the pattern verification method according to the present invention can adopt the following conformations.

(1) The verification method of a semiconductor integrated circuit pattern includes the first process of extracting a pattern which is not greater than a preset pattern size, the second process of performing lithography simulation to the extracted pattern and the third process of verifying the pattern based on a result of the lithography simulation.

(2) The verification method of a semiconductor integrated circuit pattern includes the first process of sorting integrated circuit patterns based on pattern sizes or pattern types, the second process of performing lithography simulation with respect to each pattern group while changing respective lithography simulation conditions, and the third process of verifying the patterns from results of the lithography simulation while changing respective verification specifications.

(3) The lithography simulation conditions which are changed in accordance with the pattern group are simulation evaluation points, and an edge is finely divided and simulation is carried out with more evaluation points with respect to a pattern group sorted into patterns having small pattern size values, patterns which are important in terms of a device or dense patterns.

(4) The lithography simulation conditions which are changed in accordance with the pattern group are simulation models taken into simulation, and simulation using a highly accurate simulation model must be performed with respect to a pattern group or the like sorted into patterns having small pattern size values, patterns which are important in terms of a device or dense patterns.

(5) The simulation model is a model in which one of a vector model, a step model on an exposure mask, a step model on a processing target substrate, an etching model, a resist material model and resist process model is taken.

(6) The lithography simulation conditions which are changed in accordance with the pattern group correspond to an optical length (an objective range) which is taken into simulation, and simulation having a long optical length set therein is applied to a pattern group or the like sorted into patterns having small pattern size values, patterns which are important in terms of a device or dense patterns.

(7) The lithography simulation conditions which are changed in accordance with the pattern group correspond to each error cause taken into simulation, and simulation in which many error causes are taken is applied to a pattern group or the like sorted into patterns having small pattern size values, patterns which are important in terms of a device or dense patterns.

(8) The error cause is one of an error concerning a mask, an error concerning an illumination system, an error concerning a focusing system and an error concerning a resist.

(9) The error concerning the illumination system relates to unevenness in dose amounts in manufacture.

(10) The error concerning the focusing system relates to unevenness in focusing amounts in manufacture.

(11) The conditions sorted based on pattern sizes or pattern types are a pattern size, a level of device importance and a density.

(12) The pattern sorted based on a small pattern size value is a pattern having a width which is not greater than a preset size and a pattern having a space which is not greater than a preset size, and highly accurate lithography simulation is carried out with respect to a pattern having a smaller size.

(13) The important pattern which is sorted based on a level of device importance is a Gate portion, an End Cap portion or a Contact/Via containing portion, and highly accurate lithography simulation is carried out with respect to a pattern group sorted into the important pattern.

(14) The dense pattern which is a pattern sorted based on a density is a line-and-space pattern which is not greater than a preset size or a narrow space pattern, and highly accurate lithography simulation is performed with respect to a pattern group sorted into the dense line-and-space pattern.

(15) As the pattern sorted based on a pattern size, simulation with a reduced simulation accuracy or simple check is carried out with respect to a pattern having a larger size, e.g., a pattern having a width equal to or above a preset size or a pattern having a space equal to or above a preset size.

(16) The unimportant pattern sorted based on a level of device importance is a dummy pattern portion, and simulation with a reduced simulation accuracy or simple size check is carried out with respect to the unimportant pattern.

(17) The sparse pattern sorted based on a density is a line-and-space pattern equal to or above a preset size or an isolated pattern, and simulation with a reduced simulation accuracy or simple size check is carried out with respect to a pattern group sorted into the sparse pattern.

(18) As the simple size check, size check based on design rules (DRC) is effected without performing simulation with respect to a pattern to which a very large tolerance is allowed, a pattern type which must have a preset size, a pattern having no change in environment within an optical radius or the like.

(19) In the process of performing lithography simulation while changing conditions of lithography simulation, a simulation model of a sorted pattern is applied to collectively perform simulation.
(20) In the process of extracting or sorting each pattern, a process of extracting or sorting data after OPC by using pattern information on source data is added.
(21) As the verification specification which is changed in accordance with the simulation conditions, a rigorous specification is applied to a pattern subjected to simulation using a highly accurate simulation model, and a moderate specification is applied to a pattern subjected to simulation with a reduced simulation accuracy.
(22) An integrated circuit pattern is retouched by using the pattern verification method.
(23) A mask pattern of an exposure mask is corrected by using the pattern verification method.
(24) A storage medium for semiconductor integrated pattern verification, retouch and correction is created by using the pattern verification method, the retouch method and the correction method.
(25) An apparatus for semiconductor integrated circuit pattern, retouch and correction is manufactured by using the pattern verification method, the retouch method and the correction method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:
    preparing design pattern data;
    processing the design pattern data to generate new design pattern data for creation of a mask, the processing including
    sorting integrated circuit patterns into a plurality of pattern groups based on pattern sizes or pattern types, and
    performing lithography simulation to the plurality of sorted pattern groups to verify the patterns, including determining different objective ranges for different pattern groups;
    creating a mask from the new design pattern data;
    forming a predetermined film on a semiconductor wafer and then patterning the predetermined film by photolithography using the mask to form wiring lines;
    dicing the semiconductor wafer to form a plurality of chips; and
    mounting each of the plurality of chips on a predetermined package and connecting the wiring lines to package terminals to perform electrical inspection.

2. The manufacturing method of a semiconductor device according to claim 1, wherein said performing the lithography simulation with respect to a pattern to which a tolerance which is not smaller than a specified value is allowed, a pattern whose minimum size alone is specified and a pattern whose environment is substantially fixed within a specified objective range includes effecting size check based on design rules.

3. The manufacturing method of a semiconductor device according to claim 1, wherein said sorting into a plurality of pattern groups based on pattern sizes or pattern types includes sorting based on at least one selected from the group consisting of pattern sizes, levels of device importance and pattern densities.

4. The manufacturing method of a semiconductor device according to claim 1, wherein said performing the lithography simulation includes performing the lithography simulation while changing at least one condition selected from the group consisting of the number of evaluation points with which the simulation is carried out, a model of the simulation, and an error cause taken into simulation.

* * * * *